United States Patent
Fang et al.

(10) Patent No.: US 9,087,880 B2
(45) Date of Patent: Jul. 21, 2015

(54) REMOVING METAL FILLS IN A WIRING LAYER

(71) Applicant: International Business Machines Corporation, Armonk, NY (US)

(72) Inventors: DaSheng Fang, Shanghai (CN); Yuan Quan, Shanghai (CN); Xiaoxia Wang, Shanghai (CN); Liang Ying Zeng, Shanghai (CN); Jingyang Zhang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/328,760

(22) Filed: Jul. 11, 2014

(65) Prior Publication Data

US 2015/0035153 A1 Feb. 5, 2015

(30) Foreign Application Priority Data

Jul. 31, 2013 (CN) .......................... 2013 1 0328842

(51) Int. Cl.
*H01L 21/4763* (2006.01)
*H01L 21/768* (2006.01)
*H01L 23/498* (2006.01)

(52) U.S. Cl.
CPC .... *H01L 21/76843* (2013.01); *H01L 23/49827* (2013.01)

(58) Field of Classification Search
CPC ............ H01L 23/49827; H01L 23/522; H01L 21/3212; H01L 21/7684; H01L 21/76877; H01L 21/76843

USPC .......................................... 438/622; 257/758
See application file for complete search history.

(56) References Cited

U.S. PATENT DOCUMENTS

| | | | |
|---|---|---|---|
| 6,608,335 B2 | 8/2003 | Dixit et al. | |
| 6,849,549 B1 * | 2/2005 | Chiou et al. | 438/692 |
| 6,998,716 B2 | 2/2006 | Hung | |
| 8,129,095 B2 * | 3/2012 | Grant et al. | 430/314 |
| 8,138,607 B2 | 3/2012 | Collins et al. | |
| 8,399,181 B2 | 3/2013 | Grant et al. | |
| 2012/0223412 A1 * | 9/2012 | Baars et al. | 257/532 |

OTHER PUBLICATIONS

Makarov et al., "FIB Process for Selective and Clean Etching Copper in High Aspect Ratio Holes", 2010 IEEE, pp. 1-4, IPFA 2010.

(Continued)

*Primary Examiner* — David Vu
(74) *Attorney, Agent, or Firm* — Catherine Ivers; Hoffman Warnick LLC

(57) ABSTRACT

The present invention relates to a semiconductor manufacturing method, a mask forming method and a semiconductor structure. According to one aspect of the invention, a semiconductor manufacturing method is provided, comprising: forming a metal wiring layer on a semiconductor substrate, the metal wiring layer comprising dielectrics and metal wires and metal FILLs within the dielectrics; removing the metal FILLs in the metal wiring layer completely to form the metal wiring layer without the metal FILLs. With the technical solution according to embodiments of the invention, undesirable influences due to metal FILLs will be eliminated.

12 Claims, 9 Drawing Sheets

(56) References Cited

OTHER PUBLICATIONS

Shilimkar et al., "Experimental Characterization of Metal Fill Placement and Size Impact on Spiral Inductors", School of Electrical Engineering and Computer Science, Oregon State University, Corvallis, OR 97331, USA, 2009 IEEE, pp. 101-104.

Ye et al., "Development of Cu Etch Process for Advanced Cu Interconnects", 1998 IEEE, pp. IITC 98-235-IITC 98-237.

Koch et al., "Development of Copper Etch Technology for Advanced Copper Interconnects", 1999 IEEE/SEMI Advanced Semiconductor Manufacturing Conference:, pp. 290-294.

CN Application 201310328842.5, entitled "Semiconductor Manufacturing Method, Mask Forming Method and Semiconductor Structure", Filed on Jul. 31, 2013.

* cited by examiner

REMOVING METAL FILLS IN A WIRING LAYER

BACKGROUND

The present invention generally relates to field of semiconductor manufacturing. More specifically, the present invention relates to a removing metal fills in a wiring layer of a semiconductor structure.

Variations in pattern density of metal interconnections of a semiconductor structure may present processing challenges that may ultimately affect the reliability of those metal interconnection. More specifically, variations in pattern density of the metal interconnects may refer to a ratio between metal of the metal interconnections and the surrounding dielectric materials. In certain designs or layouts, some regions of the semiconductor structure may have a substantial amount of metal as compared to other regions of the semiconductor structure which may have a substantial amount of dielectric material. The above variations may produce dishing or dished contours which can be detrimental to the reliability of the metal interconnections.

SUMMARY

According to one embodiment of the present invention, a method is provided. The method may include forming a metal wiring layer on a semiconductor substrate, the metal wiring layer comprising dielectrics and metal wires and metal fills within the dielectrics, and removing the metal fills in the metal wiring layer completely to form the metal wiring layer without the metal fills.

According to another embodiment, a method for manufacturing a mask is provided. The method may include obtaining a layout design of a metal wiring layer of an integrated circuit, the metal wiring layer comprising dielectrics and metal wires and metal fills within the dielectrics, defining borders of all regions containing the metal fills by identifying farms of the metal fills, the borders are spaced from the metal wires and the metal fills, respectively, and forming, on a mask substrate, a pattern defined by the borders, the pattern functions to completely remove the metal fills in the metal wiring layer, thereby forming the metal wiring layer without the metal fills.

According to another embodiment, a structure is provided. The structure may include a semiconductor substrate, and a metal wiring layer on the semiconductor substrate, the metal wiring layer comprising dielectrics and metal wires within the dielectrics, wherein the metal wiring layer does not have metal fills at all.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

Figure 1A:
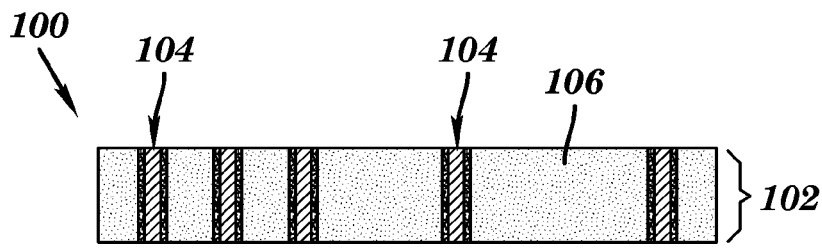
FIGS. 1A to 1H illustratively shows cross sectional views of a method for manufacturing a wiring layer.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring now to FIGS. 1A-1H, process steps for forming metal, for example copper, layers having FILLs, are shown. It should be noted that the following description and corresponding figures will focus on metal layers and dielectrics between metal layers. Minor process steps like liner deposition, copper seed deposition, and wafer cleaning, may be omitted.

Figure 1B:
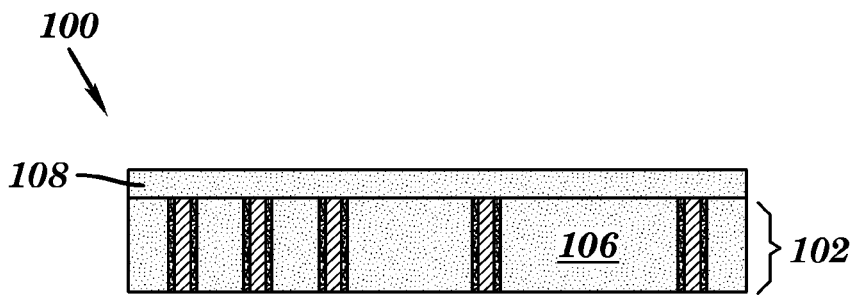
Figure 1C:
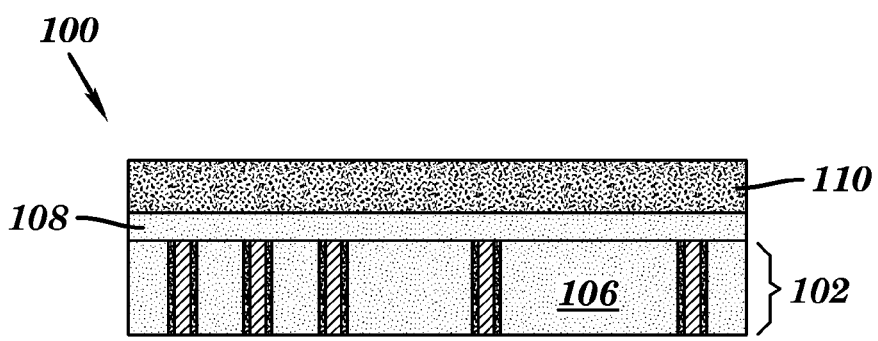
Figure 1D:
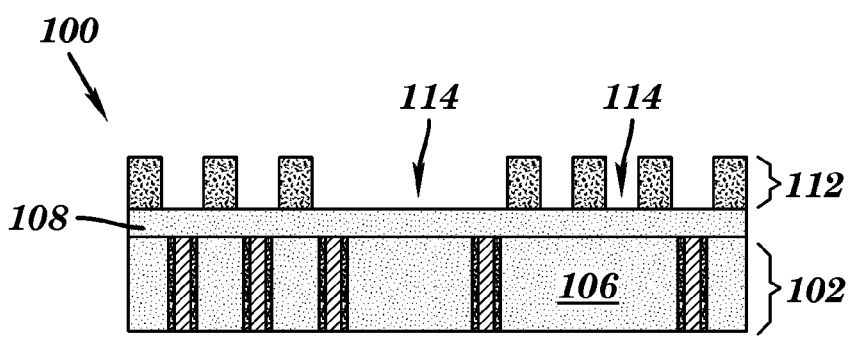
Figure 1E:
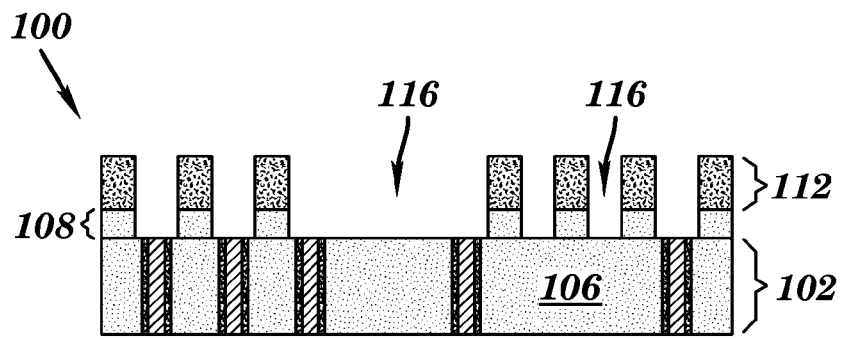
Figure 1F:
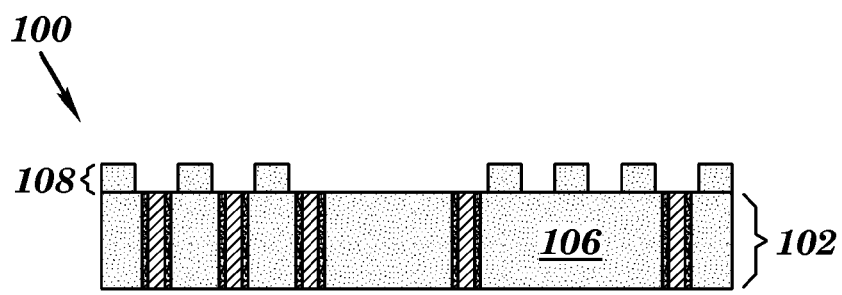
Figure 1G:
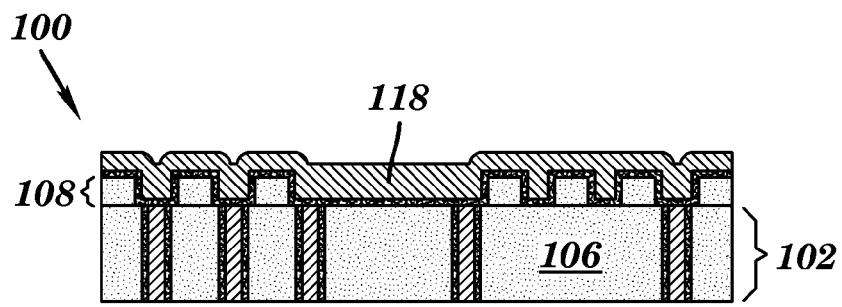
Figure 1H:
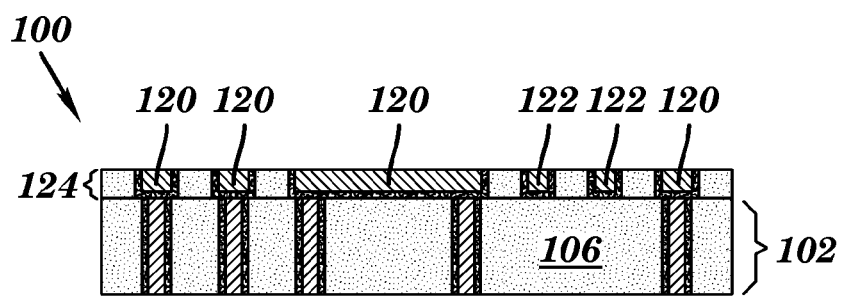

Referring now to FIG. 1A, a structure 100 is shown. The structure 100 may include a last via layer 102 including a plurality of vias 104 (hereinafter "vias") fabricated in a semiconductor substrate 106. A dielectric layer 108 may be deposited or grown above the last via layer 102, as shown in FIG. 1B. The dielectric layer 108 may include, for example, silicon dioxide. A photoresist 110 may be deposited on the dielectric layer 108, as shown in FIG. 1C. A first mask may be used to pattern the photoresist 110 through exposure and developing to form a patterned resist 112, as shown in FIG. 1D. The patterned resist 112 may include openings 114 for forming metal wires and metal fills in the dielectric layer 108 to form a metal wiring layer. Next, the dielectric layer 108 may be etched to form trenches 116 in the dielectric layer 108 for the metal wires and the metal fills, as shown in FIG. 1E. The patterned resist 112 may then be removed, as shown in FIG. 1F. A metal 118, such as, for example copper, may be deposited on a top surface of the dielectric layer 108 and within the trenches 116, as shown in FIG. 1G. Alternatively, a conductive liner layer (not shown), such as, for example, Ta/TaN, may first be deposited to separate the metal 118 from the dielectric layer 108. Finally, the metal 118 may be polished, using for example a Chemical-Mechanical Polishing (CMP) technique, to remove excess metal 118 from the top surface of the dielectric layer 108, as shown in FIG. 1H. The metal 118 may be polished such that metal wires 120 and metal fills 122 may remain within the trenches 116 (FIG. 1E). A top surface of the metal wires 120 and a top surface of the metal fills 122 may be substantially flush or coplaner with the top surface of the dielectric layer 108, thereby finishing manufacturing of a metal wiring layer 124, as shown in FIG. 1H.

Figure 2A:
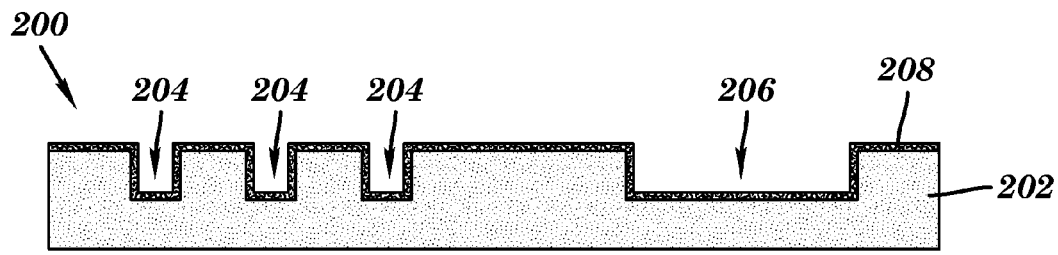
FIGS. 2A to 2D illustratively shows dishes caused during manufacturing due to high/low metal distribution density.
Figure 2B:
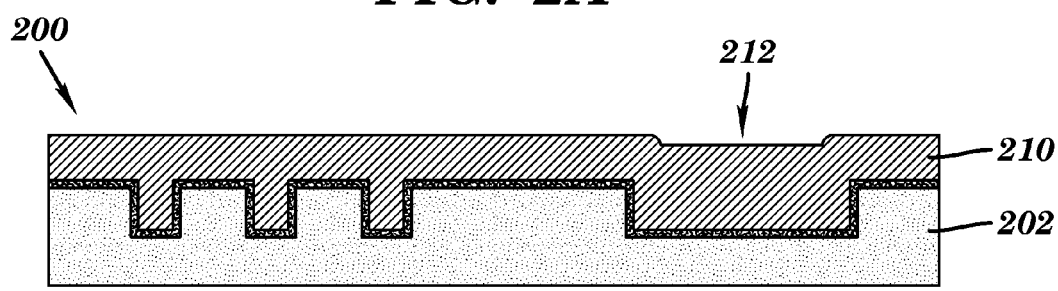
Figure 2C:
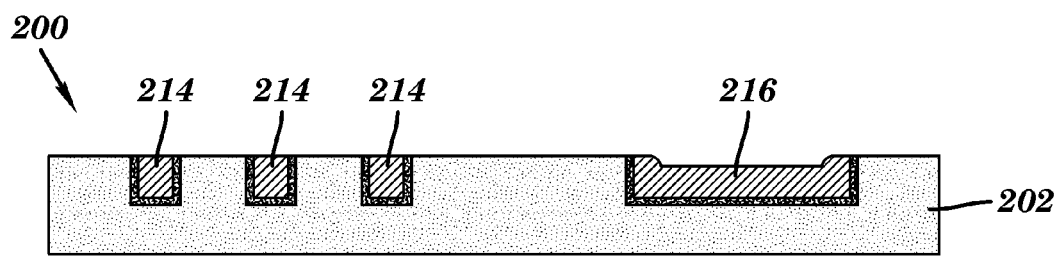

Referring now to FIGS. 2A-2D, a structure 200 is shown. The structure 200 may be substantially similar to the structure 100 described above. The structure 200 may include a dielectric layer 202 having a plurality of small trenches 204 and a large trench 206. It should be noted that the structure 200 may include any number of small trenches 204 and large trenches 206 regardless of the number illustrated in the figures. A liner 208 may be deposited in the trenches 204, 206, as shown in FIG. 2A. Next a metal 210, for example copper, may be deposited directly on top of the liner 208 and within the trenches 204, 206, as illustrated in FIG. 2B. During deposition of the metal 210, a first dish 212 may form at a top surface of the metal 210 directly above the large trench 206. The first dish 212 may be caused by the geometry and large size of the large trench 206. Next the metal 210 may be polished, using for example a Chemical-Mechanical Polishing (CMP) technique, to remove excess metal 210 from the top surface of the dielectric layer 202 to form a plurality of small metal features 214 and a large metal feature 216, as shown in FIG. 2C. It should be noted that the first dish 212 may remain atop the large metal feature 216 after polishing. Similarly, a second dish 218 may be created in a top surface of the dielectric layer 202. The second dish 218 may also be formed during polishing of the metal 210. Generally, a dished contour, such as, for example, the first dish 212, may form during polishing in areas of the structure having large metal areas. Similarly, a dished contour, such as, for example, the second dish 218, may form during polishing in areas of the structure having large dielectric areas.

Dished contours can destroy the shape of the metal features. Metal that is excessively removed to form the dished contour may be replaced by a dielectric material in subsequent processes. The addition of the dielectric material may lead to an unwarranted change in electrical parameters, for example increasing the metal resistance, or causing broken (open) wires. In addition, the dished contours in either the large metal feature 216 or the dielectric layer 202 may impact geometrical profile of layers subsequently formed thereon.

Figure 2D:
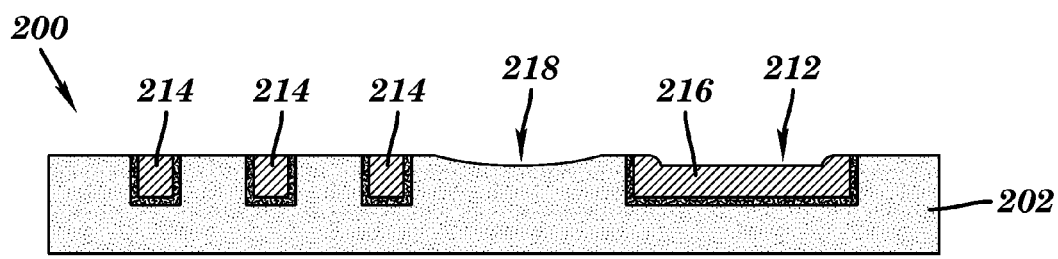

The metal fills 122 described above with reference to FIGS. 1A-1H may be used to eliminate or substantially reduce the dished contours illustrates in FIG. 2D. Farms or groupings of small pieces of floating metals are placed in white spaces and low metal density regions of a structure so that the overall metal density stays within an appropriate range and metal distribution all over the wafer is relatively uniform. As shown in FIG. 1H, the two FILLs 122 are not connected to any other metal or via.

Figure 3A:
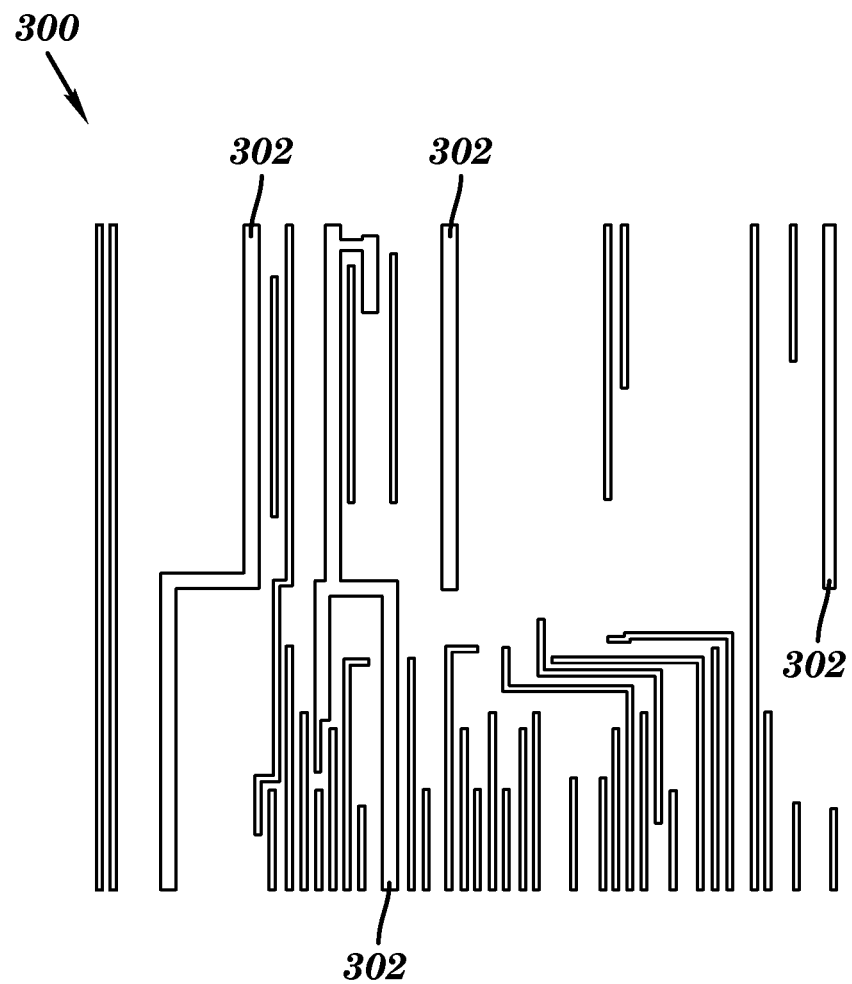
FIGS. 3A and 3B illustratively show a metal wire layout without metal fills and a post processed layout with metal fills added, respectively.
Figure 3B:
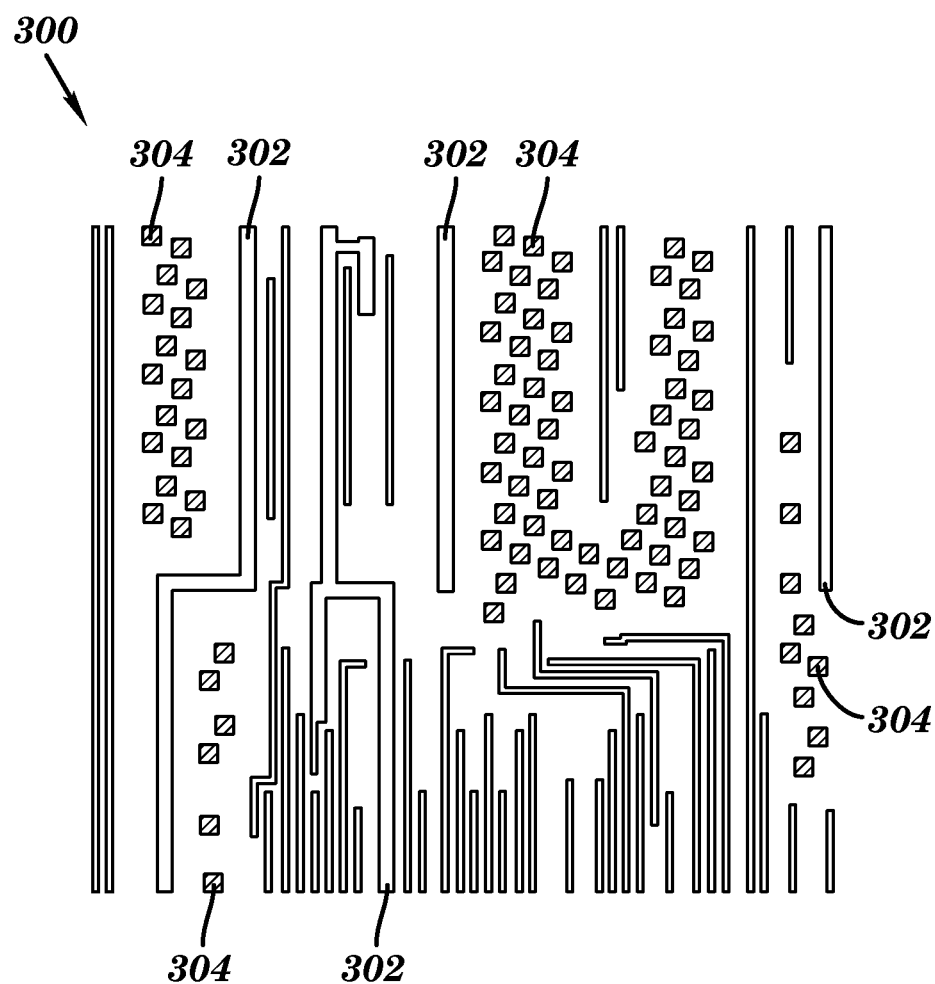

Referring now to FIGS. 3A-3B, a top view of a structure 300 is shown. The structure 300 in FIG. 3A illustrates a circuit layout of multiple metal wires 302. The structure 300 in FIG. 3B illustrates the circuit layout of multiple metal wires 302 with the addition of metal fills 304. It should be noted that the metal wires 302 and the metal fills 304 are substantially similar to the metal wires 120 and the metal fills 122 described above with reference to FIGS. 1A-1H.

Generally, most circuit designs cannot not satisfy the meal density required by polishing process, and therefore FILLs can be used to achieve positive polishing results. FILLs make metal density close to uniform across the chip; however at the same time, FILLs may introduce additional complications.

The additional complications may include, for example, (1) parasitic capacitance may be introduced between metal wires and adjacent FILLs. This parasitic capacitance may have a negative impact on circuit performance, such as, for example, slowing down signal transmission and coupling high frequency noise. The parasitic capacitance introduced by vertically and horizontally adjacent FILLs may contribute up to 20% of the overall parasitic capacitance for an inductor device.

(2) Additional technology, development, resources, and efforts may be required to precisely extract and model the parasitics concerning a circuit layout having FILLs. A developer may need to spend a significant amount of time to model the addition of FILLs.

(3) Inductor features such as quality factor (Q) and inductance may be substantially degraded by vertically and horizontally adjacent FILLs.

(4) Tremendous simulation effort is required when EM analysis tools have to take account for a relatively large number of FILLs. Such additional complex simulations may prevent EM tools from outputting a result within a reasonable time.

(5) FILLs may not be reproducible or repeatable. In other words, FILLs may lie in a different region or pattern for various layouts and circuit designs. Stated differently, the location and pattern of the FILLs is highly dependent of the circuit layout and design. This makes the above issues even more critical because it's hard for circuit designers and/or EAD tools to model how the FILLs exactly look like on real silicon wafer.

Designers generally prefer not to use FILLs due to the limitations mentioned above. Furthermore, more than 50% of the DRC rule waivers are concerned with waiving the requirements for FILLs.

Solutions addressing the above limitations may include:

(1) Grounded FILLs: the metal fills are grounded, the only advantage of grounded FILLs could be simplifying EDA assisted FILL generation, simplifying modeling and EM simulation. It does not help on reducing parasitic or improving device performance.

(2) Special FILL structures: continuous FILLs on metal layers and via layers surrounding metal wires have been broken into pieces or sections.

(3) Special FILL patterns: diamond FILL patterns instead of conventional square or rectangular FILL patterns are used to reduce parasitic capacitance.

Drawbacks of the above solutions may include, because the FILLS are not completely removed, any undesirable impact on the circuit design caused by FILLs cannot be completely eliminated. Rather, the above measures may be taken to reduce or limit any undesirable impact. Therefore, impact of FILLs still needs to be taken into account by a designer during device modeling and EM simulation.

A method for completely removing metal fills in a wiring layer according to embodiments of the invention will be described below with reference to FIGS. 4A, 4B, and 5A-5G. For the purpose of describing embodiments of the invention, the term "metal wiring layer" should be interpreted as a layer containing metal wires and/or vias.

Figure 4A:
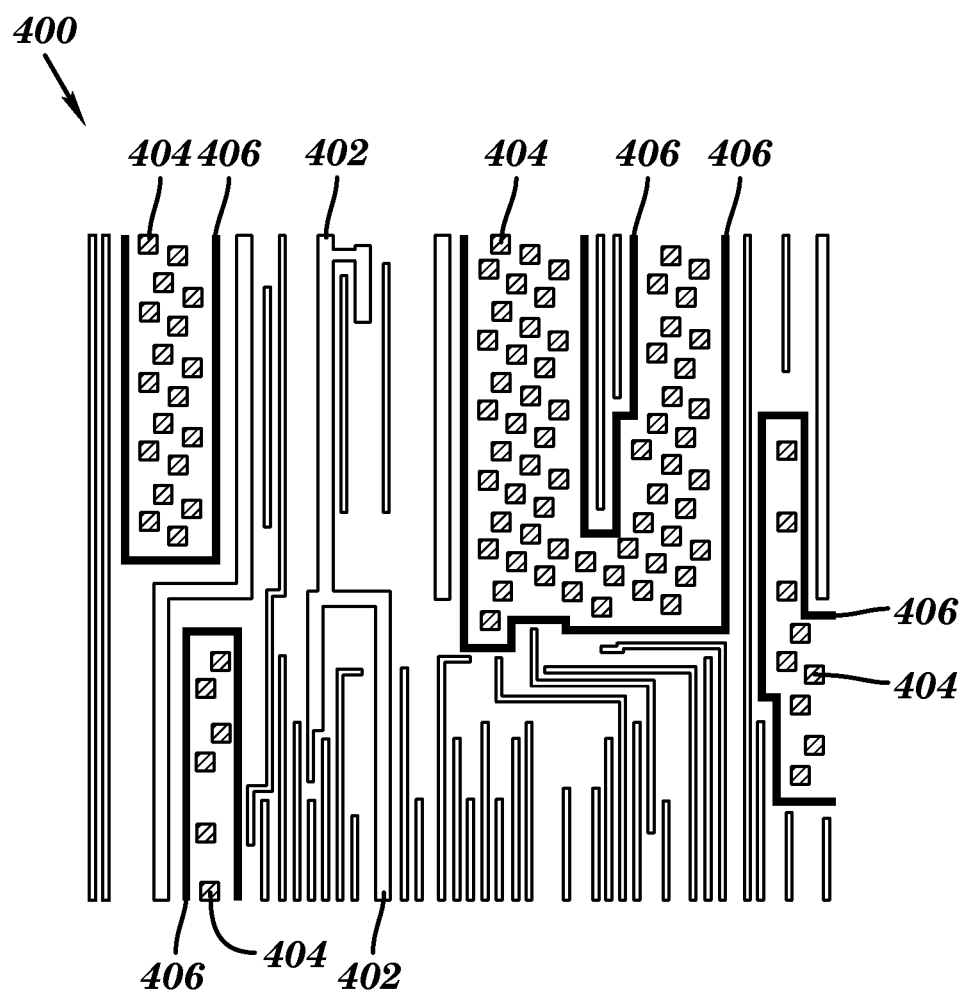
FIGS. 4A and 4B illustratively show borders of farms or groups of metal fills and a mask pattern, respectively.
Figure 4B:
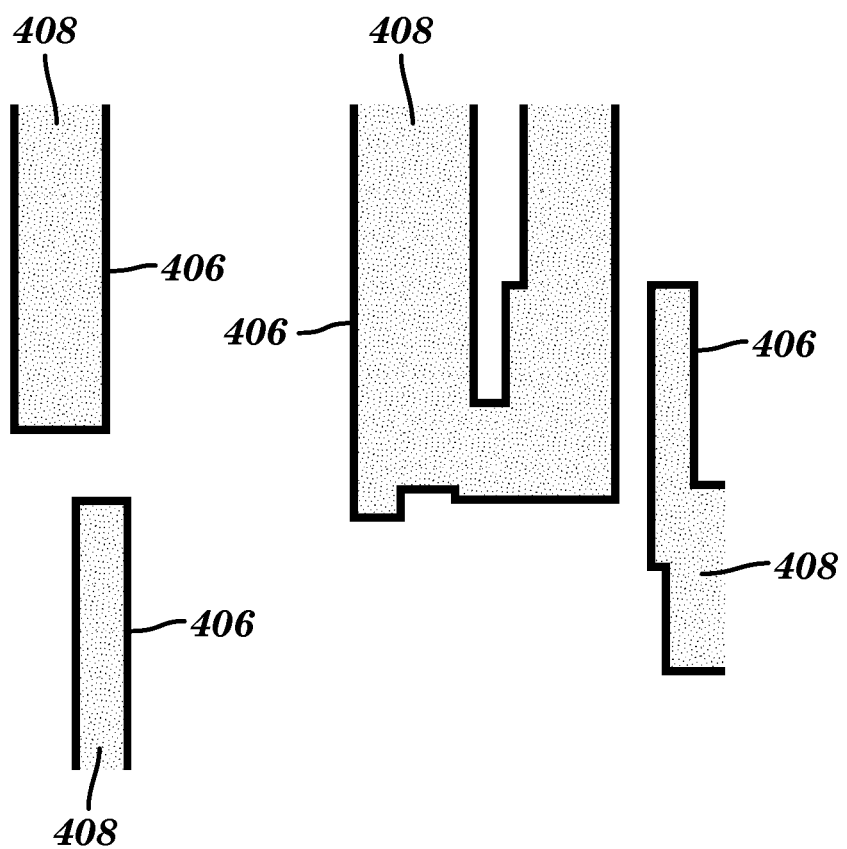

Referring now to FIGS. 4A-4B, a top view of a metal wiring layer 400 is shown according to an embodiment of the present invention. FIG. 4A illustrates a circuit layout of multiple metal wires 402 and groups of metal fills 404 each surrounded by a border 406. It should be noted that the metal wires 402 and the metal FILLS 404 are substantially similar to the metal wires 120 and the metal fills 122 described above with reference to FIGS. 1A-1H. FIG. 4B illustrates an example mask 408 which may be used to completely remove the metal fills 122.

More specifically, in FIG. 4A, the thin outlined strips may represent the metal wires 402 and the cross-hatched square tiles may represent the metal fills 404. Borders of each batch of tiles, indicated by solid lines 406, are outlined by software, which is part of the existing software that works out FILL patterns. The software ensures that the borders 406 are spaced from the metal wires 402 and from metal fills 404, respectively. Thus, all metal fills 404 in the wiring layer 400 may be located within a corresponding border. The mask 408, as defined by each border 406, may be printed on a mask substrate. The mask 408 may be used in removing the metal fills 404. More specifically, the mask 408 may be used to expose all regions containing metal fills 404 in the metal wiring layer 400, so as to completely remove the metal fills 404 from the metal wiring layer 400.

Figure 5A:
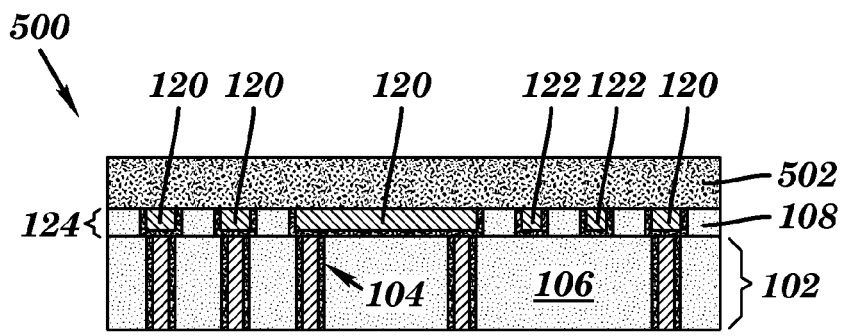
FIGS. 5A to 5G illustratively show additional process steps for removing metal fills according to embodiments of the invention.

Referring now to FIG. 5A, a demonstrative illustration of a structure 500 shown during an intermediate step of a method of removing FILLs in a wiring layer. More specifically, the method can start with applying a photoresist. It should be noted that for purposes of this description, and without limitation, the initial structure 500 of FIG. 5A is substantially similar to the structure 100 of FIG. 1H.

Like above, the structure 500 may include the last via layer 102 and the metal wiring layer 124. The last via layer 102 may include the vias 104. The metal wiring layer 124 may include metal wires 120 and metal fills 122. Alternatively, a conductive liner layer (not shown), such as, for example, Ta/TaN, may also be include as described above. A photoresist 502, similar to the photoresist 110 (FIG. 1C), may be deposited above the metal wiring layer 124. More specifically, similar to FIG. 1C, in FIG. 5A, the photoresist 502 may be applied on the metal wiring layer 124 using known techniques, such as, for example, spin-on, to cover top surface of dielectrics, the metal wires 120 and the metal fills 122 in the metal wiring layer 124. The photoresist 502 may be positive photoresist or negative photoresist in the art.

Figure 5B:
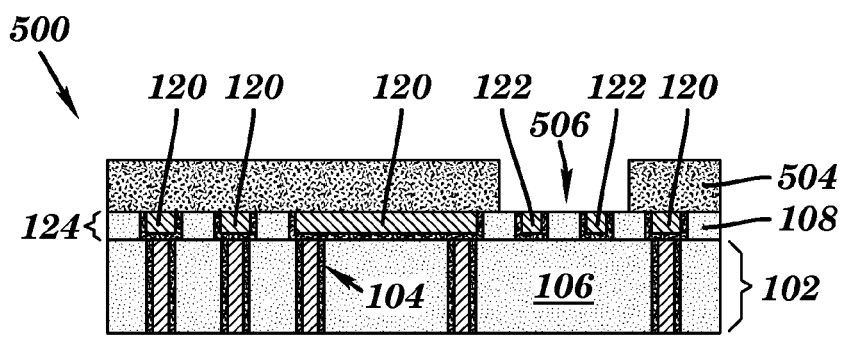

Referring now to FIG. 5B, the photoresist 502 may be patterned to form a patterned photoresist 504. The photoresist 502 may be patterned similar to the photoresist 112 described above with reference to FIG. 1D. Similarly, any typical resist patterning technique well known in the art may be used to pattern the photoresist 502. For example, the patterning technique may include exposing and developing the photoresist 502 to form the patterned photoresist 504. The patterned photoresist 504 may have one or more openings 506 exposing all regions of the structure 500 which contain the metal fills 122 within the metal wiring layer 124. The region of the structure 500 exposed by the openings 506 may further expose portions of the dielectric layer 108 surrounding the metal fills 122.

According to an embodiment of the invention, an additional mask having a mask pattern may be used for exposing all regions of the structure 500 containing the metal fills 122 within the metal wiring layer 124. For example, the mask pattern 408 (FIG. 4B), or similar, may be used to expose regions of the structure 500 which contain the metal fills 122.

Figure 5C:
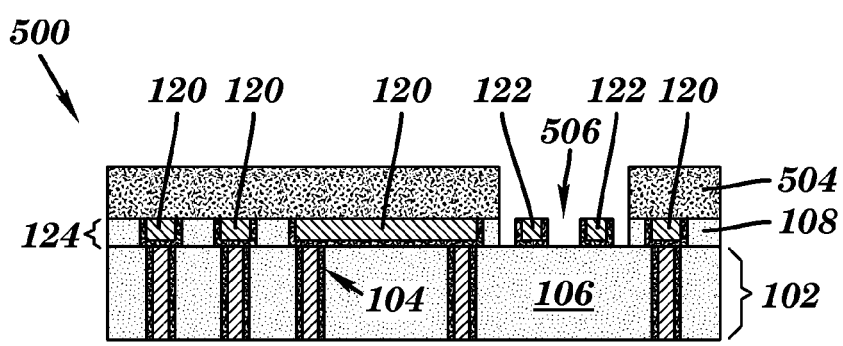

Referring now to FIG. 5C, using the patterned resist 504 as a mask portions of the dielectric layer 108 exposed by the opening 506 may be removed selective to the metal fills 122, and selective to the semiconductor substrate 106. The dielectric layer 108 exposed by the opening 506 may be removed by using any typical wet etching technique, a dry etching technique (for example, RIE), or a combination thereof.

Figure 5D:
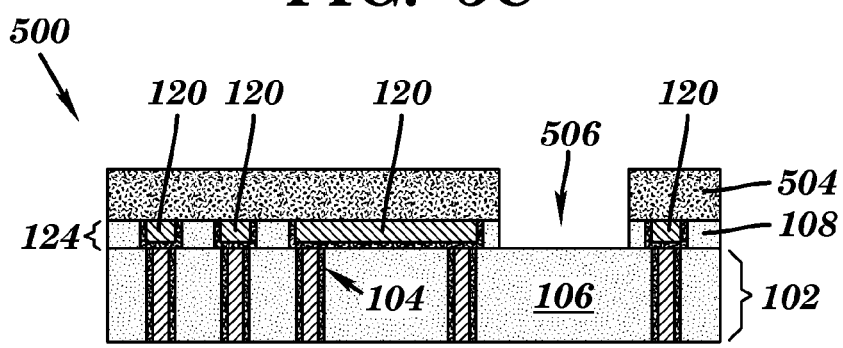

Referring now to FIG. 5D, using a dry etching technique, a wet etching technique, or a combination thereof the metal fills 122 may be removed from within the opening 506. For example, a typical copper wet etching technique common to CMOS processing may be used. According to an embodiment in which the metal wires 120 and the metal fills 122 may include core conductors and conductive liner layers on a side surface and a bottom surface of the core conductors, a single step may be used to etch the core conductor and the conductive liner simultaneously, or separated etching steps may be employed to etch the core conductor and the conductive liner respectively.

Figure 5E:
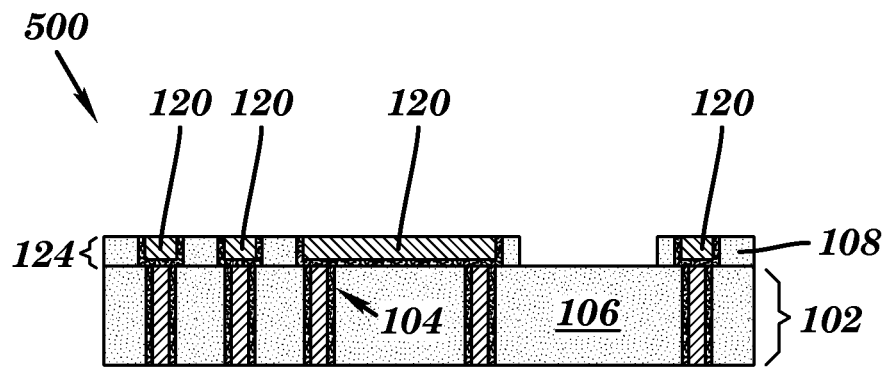

Referring now to FIG. 5E, the patterned resist 504 may be removed according to techniques well known in the art.

Figure 5F:
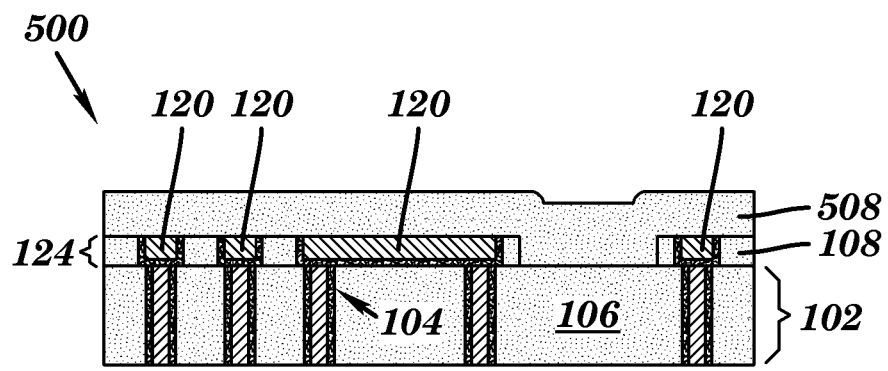

Referring now to FIG. 5F, a dielectric fill material 508 may be deposited on top of the structure 500. More specifically, the dielectric fill material 508 may be deposited directly above the remaining metal wires 120, remaining portions of the dielectric layer 108, and directly on top of an expose portion of the semiconductor substrate 106 exposed at a bottom of the opening 506 (FIG. 5E). The dielectric fill material 508 may include any known dielectric material, such as, for example, silicon dioxide. Further, the dielectric fill material may be the same or a different material as the initial dielectrics described above.

Figure 5G:
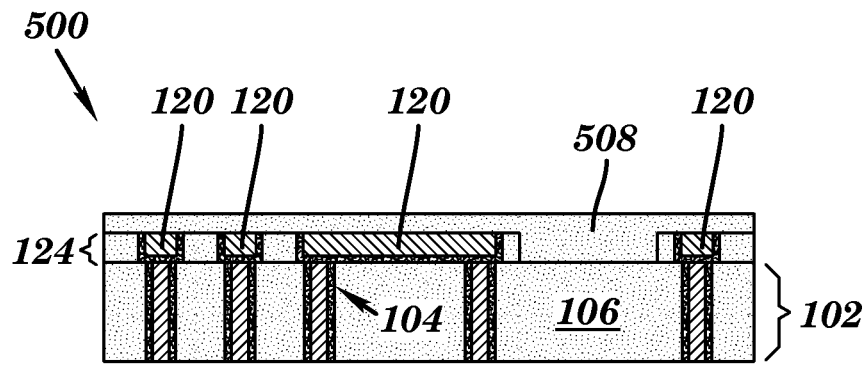

Referring now to FIG. 5G, the dielectric fill material 508 may be polished or planarized to create a smooth surface in preparation for subsequent processing. Known polishing techniques, such as, for example, chemical mechanical polishing may be used to polish or planarized the dielectric fill material 508. At this point of fabrication, the metal wire layer 124 is substantially free of all metal fills 122. In general, the dielectric material adjacent to the metal fills 122 remain undamaged and may not be degraded by the above processing steps used to remove the metal fills 122.

According to an embodiment of the invention, an optional dielectric annealing treatment may be applied according to techniques well known in the art. In particular, a bond between the dielectric layer 108 and the dielectric fill material 508 may be improved or strengthened by applying the subsequent, albeit optional, annealing treatment.

According to an alternative embodiment, the metal fills 122 may be removed selective to the dielectric layer 108 rather than removing portions of the dielectric layer 108 selective to the metal fills 122 as described above with reference to FIG. 5C. Trenches or openings in the dielectric layer 108 may remain after selectively removing the metal fills 122. As such, the techniques described above with reference to FIG. 5F may be used fill the trenches or openings with the dielectric fill material 508. Like above, in case the metal wires 120 and metal fills 122 include core conductors and conductive liner layers on a side surface and a bottom surface of the core conductors, a single step may be used to etch the core conductor and the conductive liner simultaneously, or separated etching steps may be employed to etch the core conductor and the conductive liner respectively.

Wherein, the above steps described in FIG. 5A to FIG. 5E form a second lithography step.

According to the technical solution of embodiments of the invention, once a specific metal layer with FILLs has been manufactured, and before manufacturing the next layer (which is typically a via layer connecting this metal layer to a higher metal layer), additional process steps may be employed to remove all metal fills and re-cover or backfill interlayer dielectric.

Therefore, the technical solution according to embodiments of the invention is better than the above solutions in the following aspects:

(1) Parasitic capacitance and resistance introduced by metal fills are completely eliminated;

(2) Device modeling effort can be significantly reduced because there is no need to extract parasitic parameters between devices and FILLs anymore;

(3) EM simulation is more efficient; it costs less than 10 minutes to simulate an inductor without FILLs in the EM simulation platform, however, EM simulation for the same inductor with FILLs could not finish within 24 hours;

(4) Device performance such as inductor quality factor is improved by 10% percent or more; and (5) Layout provided by circuit designers does not be modified by fabs.

Additionally, since uncertainty about difference between manufacture and simulation introduced by metal fills is completely eliminated by the solution according to embodiments of the invention, the manufactured patterns on metal layers are exactly what they drawn from designers' point of view. Designers need not to worry that there will be difference between simulation, prediction during design and actually manufactured hardware.

Since the method according to embodiments of the invention comprehensively removes all redundant metal fills in the entire circuit, parasitic impact introduced by redundant metal fills between metal wires in a same metal wiring layer and among different metal wiring layers is completely removed: for example, performance of a conductor will be affected by multiple layers of redundant metal fills therebelow, and currently there is still no disclosed approach to deal with it, however, the method according to embodiments of the invention can thoroughly resolve the adverse impact on a conductor caused by redundant metal fills beneath that conductor.

Inventor's research shows that, cost of the above additional process steps is USD 10 per wafer or less for 200 mm wafers, while the price for each wafer is on the order of USD 1000, thus having cost advantages.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor manufacturing method, comprising:
   forming a metal wiring layer on a semiconductor substrate, the metal wiring layer comprising dielectrics and metal wires and metal fills within the dielectrics; and
   removing the metal fills in the metal wiring layer completely to form the metal wiring layer without the metal fills, comprises:
      removing the dielectrics adjacent to the metal fills in all regions containing the metal fills within the metal wiring layer;
      removing the metal fills in the regions containing the metal fills;
      filling trenches formed by removing the metal fills and the dielectrics in the regions containing the metal fills with additional dielectrics; and
      polishing the additional dielectrics.

2. The method according to claim 1, further comprising: annealing the additional dielectrics.

3. The method according to claim 1, wherein, the metal fills are removed through wet etching, dry etching or a combination thereof.

4. The method according to claim 1, wherein, the dielectrics and the additional dielectrics comprise $SiO_2$ and the metal comprises Cu.

5. The method according to claim 1, wherein, the metal wires and the metal fills comprise core conductors and conductive liner layers, wherein the conductive liner layers locate on side surface and bottom surface of the core conductors.

6. The method according to claim 5, wherein, the core conductors comprise Cu, and the conductive liner layers comprise Ta or TaN.

7. The method according to claim 5, wherein, removing the metal fills comprises removing the core conductors and the conductive liner layers simultaneously.

8. The method according to claim 5, wherein, removing the metal fills comprises removing the core conductors and the conductive liner layers respectively.

9. The method according to claim 1, wherein, removing the dielectrics and the metal fills comprises:
   applying resist on the metal wiring layer;
   patterning the resist to form a patterned resist, the patterned resist having openings exposing all regions containing the metal fills within the metal wiring layer;
   etching, by using the patterned resist as etch mask, exposed dielectrics of the metal wiring layer while leaving the metal fills, thereby exposing top surfaces and side walls of the metal fills;
   etching the metal fills to form trenches in the dielectrics; and
   removing the patterned resist.

10. The method according to claim 1, wherein, the step of removing the metal fills comprises:

applying resist on the metal wiring layer;
patterning the resist to form patterned resist, the patterned resist having openings exposing all regions containing the metal fills within the metal wiring layer;
etching the metal fills to form trenches in the dielectrics; and
removing the patterned resist.

11. The method according to claim 1, wherein, forming a metal wiring layer comprises:
depositing the dielectrics on the metal wiring layer;
applying resist on the dielectrics;
patterning the resist to form patterned resist, the patterned resist having openings for forming the metal wires and the metal fills within the metal wiring layer;
etching, by using the patterned resist as etching mask, the dielectrics to form trenches for the metal wires and the metal fills in the dielectric layer;
removing the resist;
depositing the metal on top surface of the dielectric layer and in the trenches to fill the trenches; and
polishing the metal to form the metal wiring layer.

12. The method according to claim 1, wherein, forming a metal wiring layer comprises a first lithography step using a first mask, and removing the metal fills in the metal wiring layer completely comprises a second lithography step using a second mask, wherein the first mask having a first mask pattern for forming the metal wires and the metal fills in the metal wiring layer, and the second mask having a second mask pattern for completely removing the metal fills in the metal wiring layer.

* * * * *